(12) United States Patent
Wang et al.

(10) Patent No.: US 9,596,039 B2
(45) Date of Patent: Mar. 14, 2017

(54) METHOD AND DEVICE FOR TESTING RADIO FREQUENCY INDEX AND WIRELESS INDEX OF ACTIVE ANTENNA SYSTEM

(71) Applicant: ZTE CORPORATION, Shenzhen, Guangdong Province (CN)

(72) Inventors: Boming Wang, Shenzhen (CN); Xiangling Li, Shenzhen (CN); Xianfeng Guo, Shenzhen (CN); Peng Wang, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 191 days.

(21) Appl. No.: 14/409,521

(22) PCT Filed: Jul. 25, 2013

(86) PCT No.: PCT/CN2013/080110
§ 371 (c)(1),
(2) Date: Dec. 19, 2014

(87) PCT Pub. No.: WO2013/185694
PCT Pub. Date: Dec. 19, 2013

(65) Prior Publication Data
US 2015/0188647 A1 Jul. 2, 2015

(30) Foreign Application Priority Data
Jul. 27, 2012 (CN) .......................... 2012 1 0264184

(51) Int. Cl.
*H04B 17/11* (2015.01)
*G01R 35/00* (2006.01)
(Continued)

(52) U.S. Cl.
CPC .......... *H04B 17/11* (2015.01); *G01R 35/005* (2013.01); *H01Q 3/267* (2013.01); *H04B 17/00* (2013.01)

(58) Field of Classification Search
CPC ........ H04B 17/11; H04B 17/00; H04B 17/21; H04B 7/0617; H04B 17/12; H04B 7/04;
(Continued)

(56) References Cited
U.S. PATENT DOCUMENTS 5,477,229 A 12/1995 Caille et al.
6,448,787 B1 9/2002 Oglesby
(Continued)

FOREIGN PATENT DOCUMENTS

CN 1905422 A 1/2007
CN 101834678 A 9/2010
(Continued)

OTHER PUBLICATIONS

Automated System for Measurement and Characterization of Planar Active Arrays; M.A.Salas Natera et al. XP031828659AI.
(Continued)

*Primary Examiner* — Andrew Wendell
*Assistant Examiner* — Maryam Soltanzadeh
(74) *Attorney, Agent, or Firm* — Ling Wu; Stephen Yang; Ling and Yang Intellectual Property

(57) ABSTRACT

A method and apparatus for testing a radio frequency index and a wireless index of an active antenna system are provided. A probe-type testing cover based on a near field coupling mode is adopted to test the radio frequency index of the tested active antenna system. The method comprises testing cover monomer calibration, testing cover environment calibration, radio frequency index test, putting the tested active antenna system into the testing cover, wherein the test environment is the same as the calibration environ-
(Continued)

ment, and performing radio frequency test on the tested active antenna system through a radio frequency port of a test probe after compensating the test environment according to a calibration result obtained from the calibration. Further a comprehensive testing method is provided.

19 Claims, 9 Drawing Sheets

(51) Int. Cl.
   *H04B 17/00* (2015.01)
   *H01Q 3/26* (2006.01)
(58) Field of Classification Search
   CPC .. H04B 17/29; H04B 17/364; H04B 17/0085;
   H04B 7/0697; H04B 7/086; G01R
   35/005; H01Q 3/267; H04W 24/02;
   H04W 24/08
   See application file for complete search history.

(56) References Cited

U.S. PATENT DOCUMENTS

| | | | |
|---|---|---|---|
| 8,643,553 B2* | 2/2014 | Teshirogi | G01R 29/10 343/703 |
| 2003/0038747 A1 | 2/2003 | Patel et al. | |
| 2007/0243826 A1* | 10/2007 | Liu | H04B 17/3911 455/67.11 |
| 2012/0086612 A1* | 4/2012 | Linehan | G01R 29/10 343/703 |
| 2012/0188017 A1* | 7/2012 | Qian | H03F 1/0216 330/277 |
| 2012/0309323 A1* | 12/2012 | Guo | H04B 17/0087 455/67.14 |
| 2015/0188647 A1* | 7/2015 | Wang | H04B 17/00 455/67.12 |

FOREIGN PATENT DOCUMENTS

| | | |
|---|---|---|
| CN | 102395226 A | 3/2012 |
| CN | 102593570 A | 7/2012 |
| CN | 102830298 A | 12/2012 |
| CN | 102857309 A | 1/2013 |
| CN | 102857310 A | 1/2013 |
| EP | 2173005 A1 | 4/2010 |
| EP | 2469651 A1 | 6/2012 |
| JP | S62237365 A | 10/1987 |
| JP | 2005017241 A | 1/2005 |
| KR | 20110065817 A | 6/2011 |
| RU | 2265263 C2 | 11/2005 |
| RU | 130089 U1 | 7/2013 |
| WO | 9534103 A1 | 12/1995 |
| WO | 01/06595 A2 | 1/2001 |
| WO | 2007/112546 A1 | 10/2007 |
| WO | 2010131409 A1 | 11/2010 |
| WO | 2011097900 A1 | 8/2011 |

OTHER PUBLICATIONS

Calibrated Over the Air Test Environment Proposed Draft Text; Jul. 2006; ETS Lindgren; IEEE 802.11-06/076r1.

* cited by examiner

METHOD AND DEVICE FOR TESTING RADIO FREQUENCY INDEX AND WIRELESS INDEX OF ACTIVE ANTENNA SYSTEM

TECHNICAL FIELD

The present document relates to the test technology field of a radio frequency index and a wireless index of an active antenna system, and in particular, to a method and apparatus for testing a radio frequency index and a wireless index of an active antenna system.

BACKGROUND

The traditional base station device has a radio frequency port itself, the test of the radio frequency index usually adopts a conduction testing method, and the reference point of the test is at the radio frequency port of the device.

An active antenna system (AAS), acted as a base station communication subsystem integrated by a multiple channel transceiver and a base station antenna, is an integrated device of the antenna and the multiple channel transceiver, and the interface between them is shown as the internal interface, and it is difficult to perform the radio frequency port test directly on the project, which brings challenges to the test of the active antenna system like this.

The active antenna system is tested by using the conduction test method of the traditional base station device, and the active part and the antenna array part of the active antenna system need to be separated. To the active antenna system, its integrated topological structure is destroyed, and the design complexity is increased and the integrated level of the device is influenced at the same time.

It is usually thought that the space radio frequency (Over The Air, OTA) can be adopted to test the AAS, which can totally test the spatial characteristic and the radio frequency characteristic of the AAS. But the OTA test needs a professional darkroom and synchronization device, and needs a complicated test procedure and longer test duration. And, because its test cost is high and its test efficiency is low, it is more suitable to research and develop and sample authorization test, etc. And it is unnecessary to use the OTA test for the situation, such as, the production batch test, etc.; and for some CE authorization tests at the same time, it requires to be performed under the closed and high and low temperature environment, so it is very difficult to be realized by the OTA test.

SUMMARY

One technical problem that the embodiment of the present document solves is to provide a method and apparatus for testing a radio frequency index of an active antenna system, which adopts a probe type testing method and apparatus, and can finish the measurement of the radio frequency performance of the testing reference plane (the testing reference plane is also called interface in this text) of the active and passive dipole in the topological structure of the AAS device.

In order to solve the above-mentioned technical problem, the following technical scheme is adopted:

a method for testing a radio frequency index of an active antenna system, which adopts a testing cover to test the radio frequency index of a tested active antenna system, comprising:

a testing cover monomer calibration, performing a cable loss calibration to a radio frequency line of each antenna of the testing cover through a vector network analyzer;

a testing cover environment calibration, putting an antenna part in the testing cover after the monomer calibration, and fixing a spatial relationship between the antenna part and a test probe, and calibrating for a near field coupling environment between each dipole of the antenna part and the testing cover through moving the test probe; wherein, a dipole structure and composition mode of the antenna part are same as an antenna feeder part of the tested active antenna system, and the test probe is a standard antenna dipole; and a radio frequency index test, putting the tested active antenna system into the testing cover after an environment calibration, and fixing a spatial relationship between a dipole corresponding to the tested active antenna system and the test probe, wherein the test environment thereof is the same as a test environment after the testing cover environment calibration, performing radio frequency test on the tested active antenna system through a radio frequency port of the test probe after compensating the test environment according to a calibration result obtained from the calibration, and obtaining the radio frequency index of the radio frequency port of the tested active antenna system.

Preferably, the step of compensating the test environment according to a calibration result obtained from the calibration comprises:

compensating the test environment according to a testing cover monomer calibration table obtained by the testing cover monomer calibration and a test environment calibration table obtained by the testing cover environment calibration.

Preferably, the testing method further comprises:
testing antenna electrical performance of the tested active antenna system by adopting the antenna part.

Preferably, the step of fixing a spatial relationship between a dipole corresponding to the tested active antenna system and the test probe comprises:

making a polarization direction of the test probe be a same direction as a polarization direction of the dipole corresponding to the tested active antenna system.

A method for testing a wireless index of an active antenna system, comprising the radio frequency index test steps as described above, further comprising:

testing a spatial characteristic index of the active antenna system by adopting an over the air (OTA) test.

Preferably, the OTA test is conducted in a darkroom or a simulation freedom space environment, to test a directional diagram of the tested active antenna system.

Preferably, the testing method further comprises:
calibrating a test environment of the OTA.

Preferably, the OTA test comprises:
a downlink space characteristic test of the tested active antenna system: obtaining an Effective Isotropic Radiated Power (EIRP) through compensating the directional diagram of the tested active antenna system.

Preferably, the OTA test comprises:
an uplink space characteristic test of the tested active antenna system: obtaining an Effective Isotropic Reference Sensitivity (EIRS) through compensating the directional diagram of the tested active antenna system.

An apparatus for testing a radio frequency index of an active antenna system, comprising a shielding box, a positioning bracket, an antenna part, an antenna radio frequency line, a test probe, a probe location adjustment unit and a retractable absorbing plate, wherein:

the antenna part has a dipole structure and composition mode same as an antenna feeder part of the tested active antenna system, configured to be used for calibration of the testing apparatus and an antenna array test of the tested active antenna system;

the test probe is a standard antenna dipole;

the shielding box is configured to: form a space electromagnetic environment between the testing apparatus and the tested active antenna system;

the absorbing plate is located between the positioning bracket and the test probe; and the positioning bracket is configured to: fix the antenna part or the tested active antenna system, and adjust orientation of the antenna part or the active antenna system.

Preferably, the apparatus further comprises a probe location adjustment unit, wherein:

the probe location adjustment unit is configured to: fix and adjust the orientation of the test probe.

Preferably, the probe location adjustment unit comprises a slide guide set on a body of the shielding box.

Preferably, when testing a branch of the tested active antenna, the absorbing plate between the test probe and the dipole corresponding to the branch is unfolded, and the microwave plates at other locations are folded.

A method and apparatus suitable for testing the radio frequency index performance of the AAS in the above-mentioned technical scheme, on the basis of solving the practical problem met by the AAS on the testing method at present, effectively improves the testing efficiency and reduces the testing cost. The method and apparatus for testing the radio frequency index characteristic of the AAS of the embodiment of the present document can be applied to the batch production process of the AAS and the authentication test job, and can also match with the space test of the OTA at the same time, thereby being able to overall test the characteristic of the AAS.

BRIEF DESCRIPTION OF DRAWINGS

The accompanying drawings described herein are used to provide further understanding for the present document and constitute a part of the present application. The illustrated embodiments of the present document and the description thereof are used to explain the present document, rather than constituting an inappropriate limitation to the present document. Wherein.

PREFERRED EMBODIMENTS OF THE PRESENT DOCUMENT

In order to be convenient for explaining the present document, the implementation of the technical schemes of the present document is further described in detail with reference to the accompanying drawings and in combination with embodiments hereinafter. It should be illustrated that, in the case of not conflicting, the embodiments in the present application and features in these embodiments can be arbitrarily combined with each other.

Figure 1:
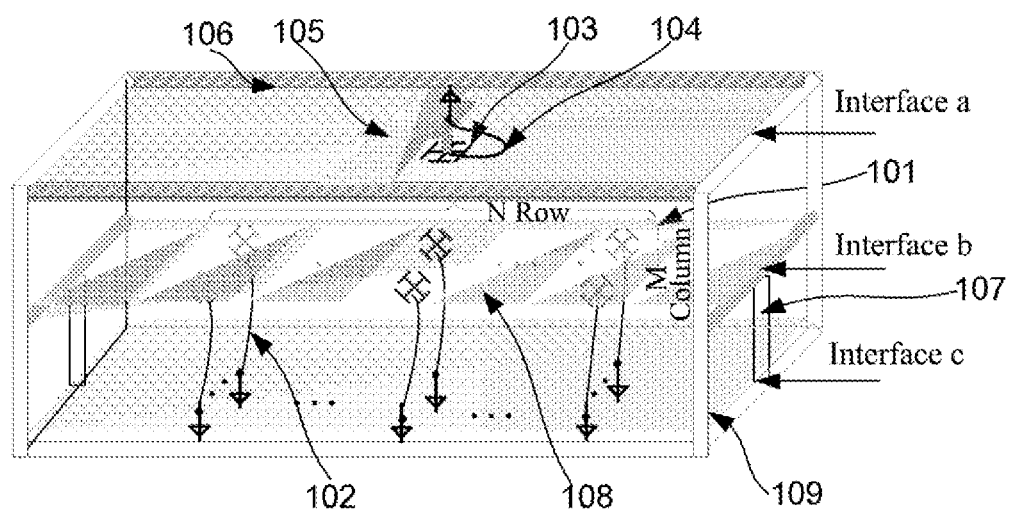
FIG. 1 is a block diagram of a basic composition of a probe-type testing apparatus.

The present document provides an apparatus for testing a radio frequency index of an active antenna system. The apparatus is equivalent to a checking apparatus, as shown in FIG. 1, made up of several following parts.

An antenna part 101 has all the same antenna array with the tested AAS, used for testing the antenna array of the AAS and calibrating the testing apparatus.

An antenna radio frequency line 102, a radio frequency cable connected between an antenna part port and an external connector, is used for introducing/extracting a radio frequency signal of each dipole of the antenna part.

A test probe 103 is a standard antenna dipole, of which the dipole structure has the requirements, such as, a fixed polarization direction, gain and standing-wave ratio, etc.

A probe radio frequency line 104 is configured as: a radio frequency cable for introducing/extracting the radio frequency signal of the test probe.

A probe location adjustment unit 105 is an apparatus which can fix and directionally move the test probe 103, and the apparatus can directionally move on the guide rail 106 of the box body.

The guide rail 106 is configured to: limit the movement path of the probe location adjustment unit 105, and can make it do the directional movement with an equal interval.

A positioning bracket 107 is configured to: adjust and fix the spatial relationship between the probe location adjustment unit 106 and the tested piece.

A absorbing plate 108 is the microwave absorbing material put between the tested piece and the guide rail 106, which can reduce the interference, such as, reflection, refraction, etc. from the internal signal between the test probe 103 and the array of the test-piece. The absorbing plate 108 can be unfolded and folded automatically along with the movement of the probe location adjustment unit 105.

A shielding box 109 is a metal case of the testing apparatus, and can shield its internal and external signals and make it have good space electromagnetic shielding ability.

The specific connection relation of the present testing apparatus is: in the shielding box 109, the tested piece AAS is fixed at one side of the box body through the positioning bracket 107, and the other side is the test probe 103 installed on the probe location adjustment unit 105, which can change the spatial relationship between the tested piece AAS and the test probe 103 through adjusting the relative position of the test probe 103 and the positioning bracket 107; there is a slide guide 106 in the box body, the probe location adjustment unit 105 slips on the guide rail, and there is a function of position and distance limitation on the guide rail, to guarantee that the test probe 103 can traverse and test every branch of the tested piece AAS. The test probe 103 is externally connected to the test instrument through the probe radio frequency line 104. When some branch is tested, then the absorbing plate 108 between the test probe 103 and the dipole corresponding to the branch of the tested piece is unfolded automatically, and the position of other dipoles will be shielded automatically. In this way, it can provide a good test environment. The antenna part 101, as a part of the testing apparatus, is all the same with the antenna part of the tested piece AAS, mainly used for testing the antenna array of the AAS and calibrating the testing apparatus.

The embodiment of the present document provides a method for testing a radio frequency index of an active antenna system, and the testing method mainly includes: a testing apparatus calibration, a testing apparatus test and an antenna electrical performance test.

The specific testing procedure of the testing method is described as follows:

1, The Testing Apparatus Calibration

The testing apparatus monomer and the near field coupling test environment need to be calibrated respectively.

The testing apparatus monomer calibration is mainly used for calibrating the antenna radio frequency line 102 of the testing apparatus, calibrating and recording the line loss for the radio frequency line of each antenna through the vector network analyzer, and producing the testing apparatus monomer calibration table.

The test environment calibration is mainly used for calibrating the near field coupling test environment of the testing apparatus, putting the antenna part 101 in the testing apparatus, fixing the spatial relationship between itself and the test probe 103, and making the polarization direction of the test probe and the polarization direction of the dipole corresponding to the tested piece be in the same direction; realizing the calibration and test for every dipole of the antenna part 101 and the near field coupling environment through the test probe 103 orientating and sliding on the testing apparatus, and producing the test environment calibration table.

2, The Testing Apparatus Test

The active antenna system of the tested piece is put in the testing apparatus, the spatial relationship between itself and the test probe 103 is fixed, and the test probe 103 makes the location movement in an equal interval on the apparatus, and the input or output of the radio frequency signal can be realized through the probe radio frequency line 104, and the active antenna system of the tested piece can be regarded as a black box to perform the radio frequency test, to obtain the corresponding measuring result.

Through looking up the testing apparatus monomer calibration table and the test environment calibration table, the calibration value is obtained and is compensated in the test environment, and the wireless radio frequency index of the radio frequency port of the active antenna system of the tested piece can be calculated with the measuring result.

3, The Antenna Electrical Performance Test

Because the antenna part 101 of the testing apparatus is all the same with the antenna array part of the active antenna system of the tested piece, the electrical performance test for the antenna part of the testing apparatus can represent the electrical characteristic of the antenna part of the active antenna system; the test items can include: the voltage standing wave ratio test, the isolation test, the calibration circuit parameter test (for the antenna with the calibration circuit) and the intermodulation test, etc., and these test items are the same with the test method of the traditional antenna array, mainly obtained by testing the S parameter of the antenna port through the vector network analyzer and testing the intermodulation product through the passive intermodulation analysis meter.

Because the performance of the antenna array is determined by the mechanical performance of the antenna design, which can guarantee that the performance is stable in the large batch production and can meet the retest requirement, the antenna electrical performance test only needs once or several times, and it can represent the antenna electrical characteristic of the AAS.

In addition, the embodiment of the present document further provides a method for testing the spatial characteristic index of the active antenna system. The AAS spatial characteristic test can inherit the test environment of the traditional base station antenna, which needs to be processed in the antenna test field, such as, the darkroom, etc. It mainly tests the spatial characteristic of the AAS, and the spatial characteristic of the AAS mainly includes: the beam control ability and precision of the AAS, the space composition gain test, half power beam width, the front-to-back ratio, the cross polarization ratio, the minor lobe level measurement, the downward inclination angle test, etc. It tests the directional diagram (relative amount) of the AAS through the environment of the antenna test field at first, and then calibrates the testing field; it can obtain the absolute amount representing the AAS space characteristic after compensating the directional diagram, which are the Effective Isotropic Radiated Power (EIRP) and the Effective Isotropic Reference Sensitivity (EIRS) respectively.

The implementation of the testing method and apparatus for the radio frequency test of the active antenna system is further described in detail by combining the specific application examples hereinafter.

1, The Testing Apparatus Calibration

1), The Testing Apparatus Monomer Calibration

Figure 2:
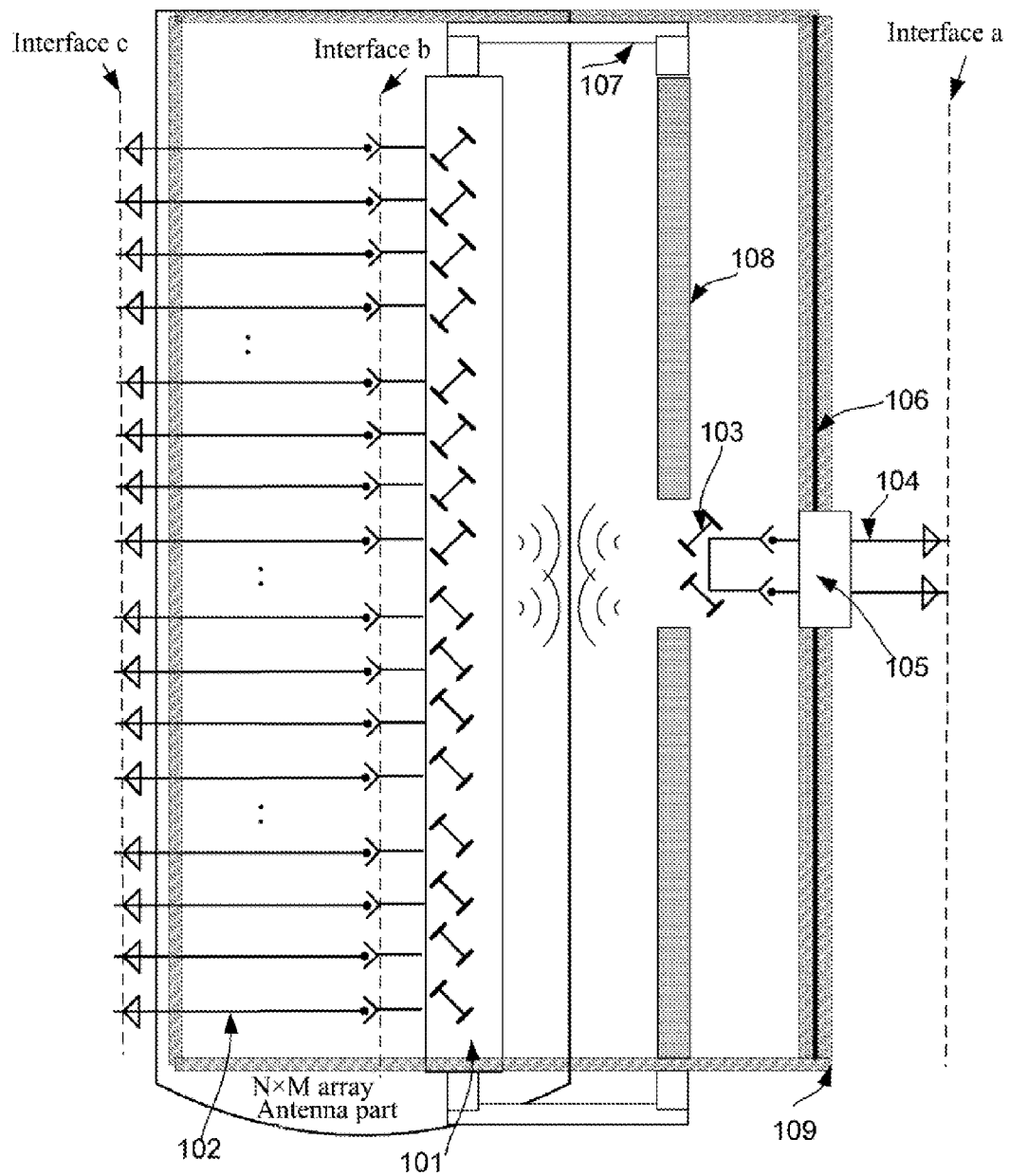
FIG. 2 is a functional block diagram of a calibration of a probe-type testing apparatus.
Figure 4:
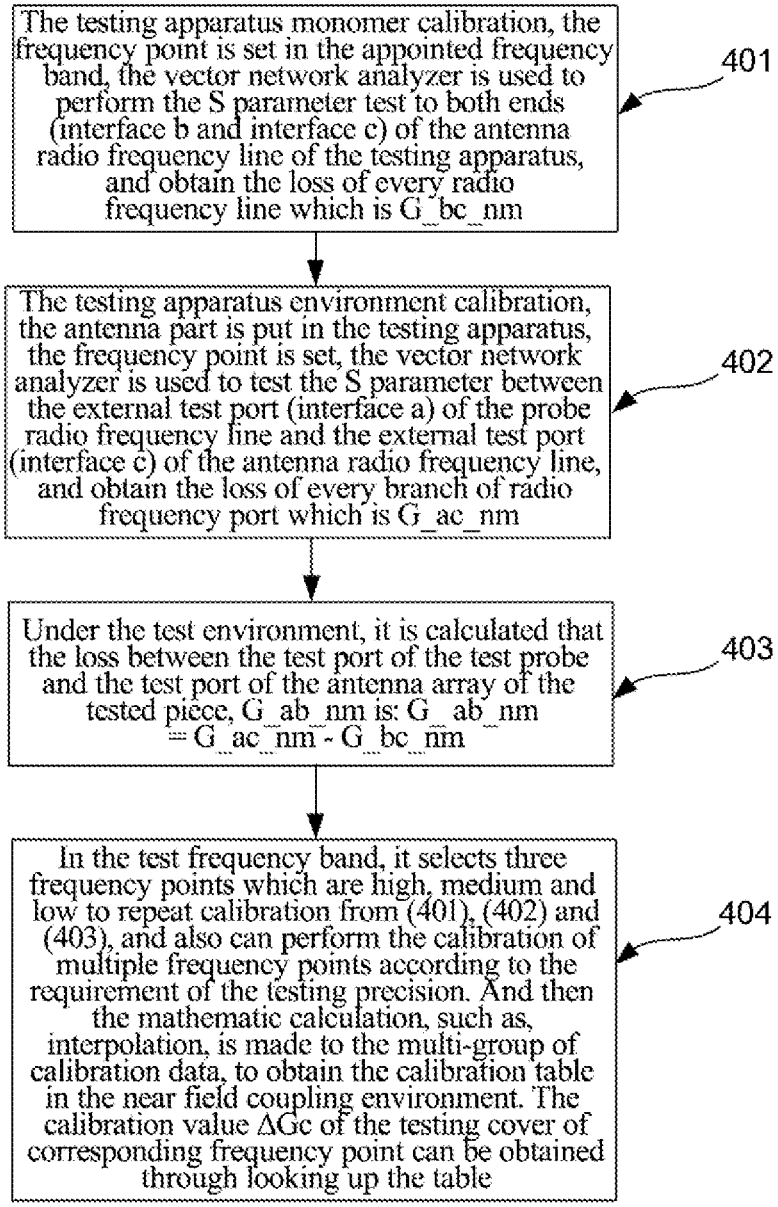
FIG. 4 is a work flow chart of a calibration of a probe-type testing apparatus.

The test environment is set as shown in FIG. 2 and the test can be made as shown in step 401 in FIG. 4.

In step 401, the frequency point is set in the appointed frequency band, the vector network analyzer is used to perform the S parameter test to both ends (interface b and interface c) of the antenna radio frequency line 102 of the testing apparatus, and obtain the loss of every radio frequency line which is $G\_bc\_nm$ (wherein, for the N×M array active antenna system, n=1, . . . , N; m=1, . . . , M).

2), The Testing Apparatus Environment Calibration

The near field coupling calibration environment is set as shown in FIG. 2, the antenna part 101 is put in the testing apparatus, the spatial relationship between itself and the test probe 103 is fixed through the probe location adjustment unit 105 and the positioning bracket 107, and the polarization direction of the test probe 103 and the polarization direction of the dipole corresponding to the tested piece are in the same direction; through the probe location adjustment unit 105 orientating and sliding on the apparatus, the calibration and the test for every dipole of the antenna part 101 and the near field coupling environment are realized, and the test can be done as shown in step 402-404 in FIG. 4.

In step 402, the frequency point is set in the appointed frequency band, the vector network analyzer is used to test the S parameter between the external test port (interface a) of the probe radio frequency line 104 and the external test port (interface c) of the antenna radio frequency line 102, and obtain the loss of every branch of radio frequency port which is $G\_ac\_nm$ (wherein, for the N×M array active antenna system, n=1, . . . , N; m=1, . . . , M).

In step 403, under the test environment, it is calculated that the loss between the test port of the test probe 103 and the test port of the antenna array of the tested piece, $G\_ab\_nm$ is:

$$G\_ab\_nm = G\_ac\_nm - G\_bc\_nm.$$

Wherein, for the N×M array active antenna system, n=1, ..., N; m=1, ..., M.

G_bc_nm is the testing apparatus monomer calibration value;

G_ac_nm is the testing apparatus environmental calibration value.

In step 404, in the required test frequency band, it can select three frequency points which are high, medium and low to repeat steps 401~403, and also can perform the calibration of multiple frequency points according to the requirement of the testing precision. Finally the mathematic calculation, such as, interpolation, is made to the multi-group of calibration data, to obtain the two-dimension table or curve corresponding to the calibration frequency and the calibration value under the test environment of the probe-type testing apparatus. The calibration value ΔGc of any frequency point in the appointed frequency band in every branch can be obtained through looking up the table.

2, The Radio Frequency Index Test

Figure 3:
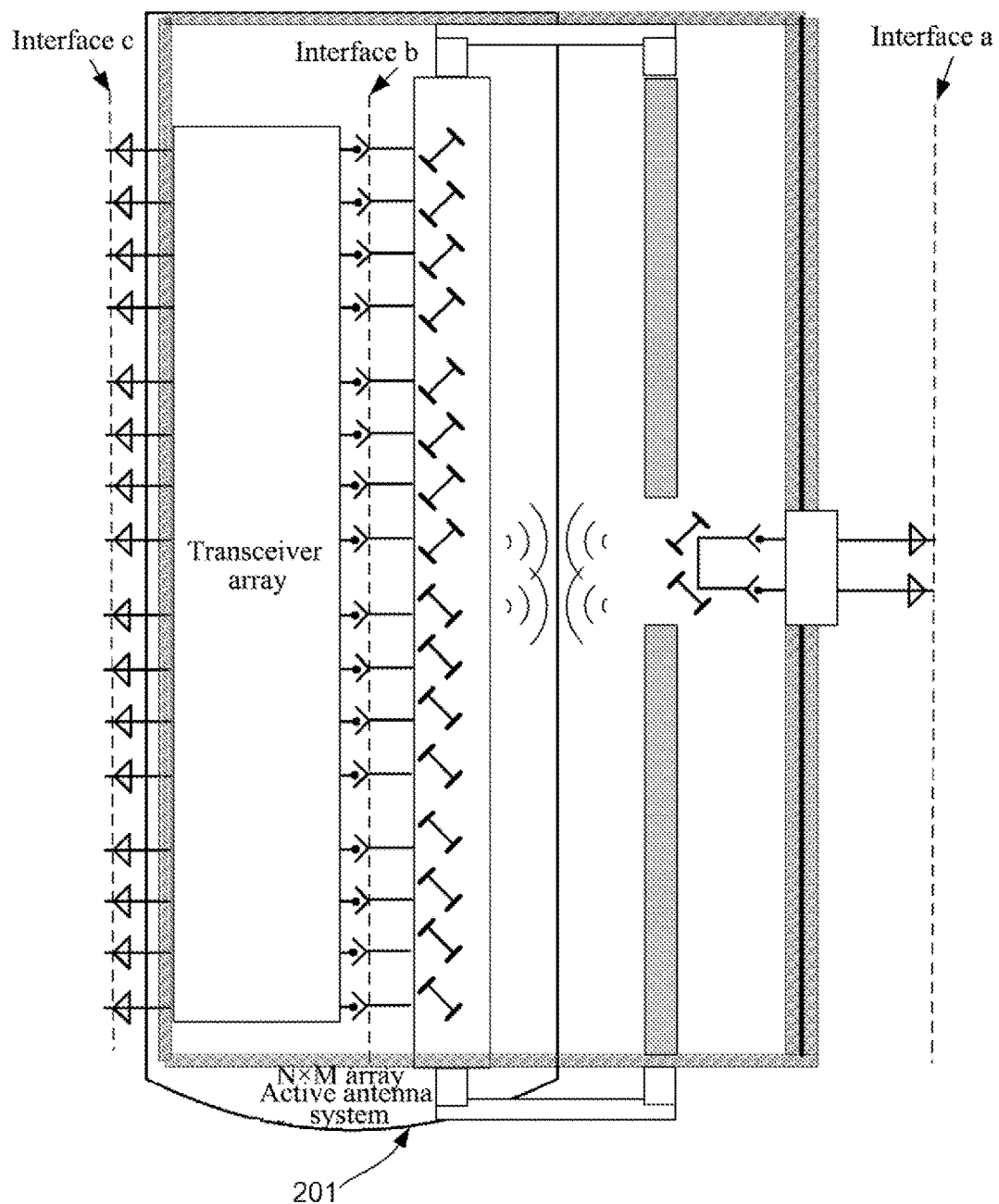
FIG. 3 is a functional block diagram of a test of a probe-type testing apparatus.
Figures 5, 6:
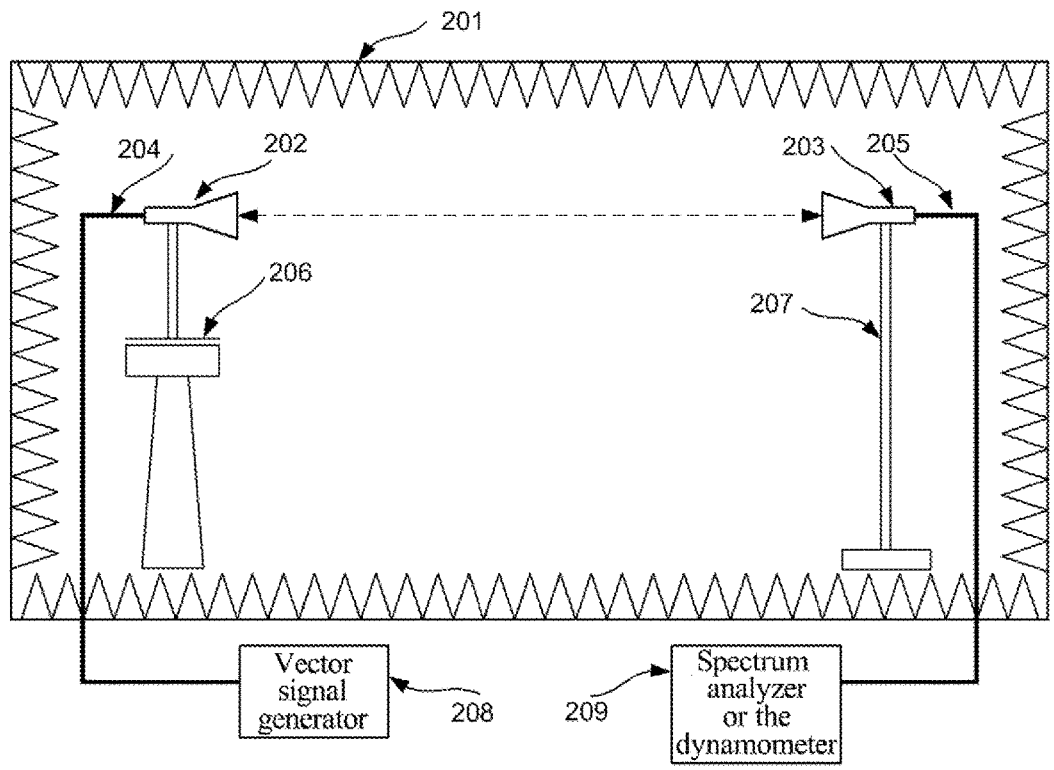
FIG. 5 is a work flow chart of a test of a probe-type testing apparatus.
FIG. 6 is a functional block diagram of calibration work in an OTA test environment.

The test environment is set as shown in FIG. 3, and the test environment is basically the same with the calibration step. Compared with the calibration test, the tested piece AAS is used to replace the antenna part and the antenna radio frequency line used in the calibration test. The test is processed according to the steps as shown in FIG. 5.

In step 501, the gain of each branch needs to be compensated at first. The approximate value of the compensation ΔGc can be found through the calibration table in the calibration step. The compensatory position can be in the digital domain of the active antenna system, and also can be in the test instrument.

In step 502, after compensating the testing apparatus, according to the requirement for the AAS BS by the 3GPP protocol, every radio frequency index test is performed to every channel of the AAS of the tested piece through the test probe. The test reference point is equivalent to the radio frequency port of the tested active antenna system.

The specific realization of the method and apparatus for testing the ASS spatial characteristic of the active antenna system is further described in detail hereinafter.

1), The Test Environment Calibration

Combined with FIG. 6, the test environment is set. Under the environment of the darkroom 201, the gain reference antenna 202 is installed on antenna rotary table 206, and is connected with the vector signal generator 208 through the radio frequency cable 204; at another end, the receiving antenna 203 is installed on the antenna bracket 207, and the receiving antenna 203 is connected to the spectrum analyzer (or the dynamometer) 209 through the radio frequency cable 205.

Figure 9:
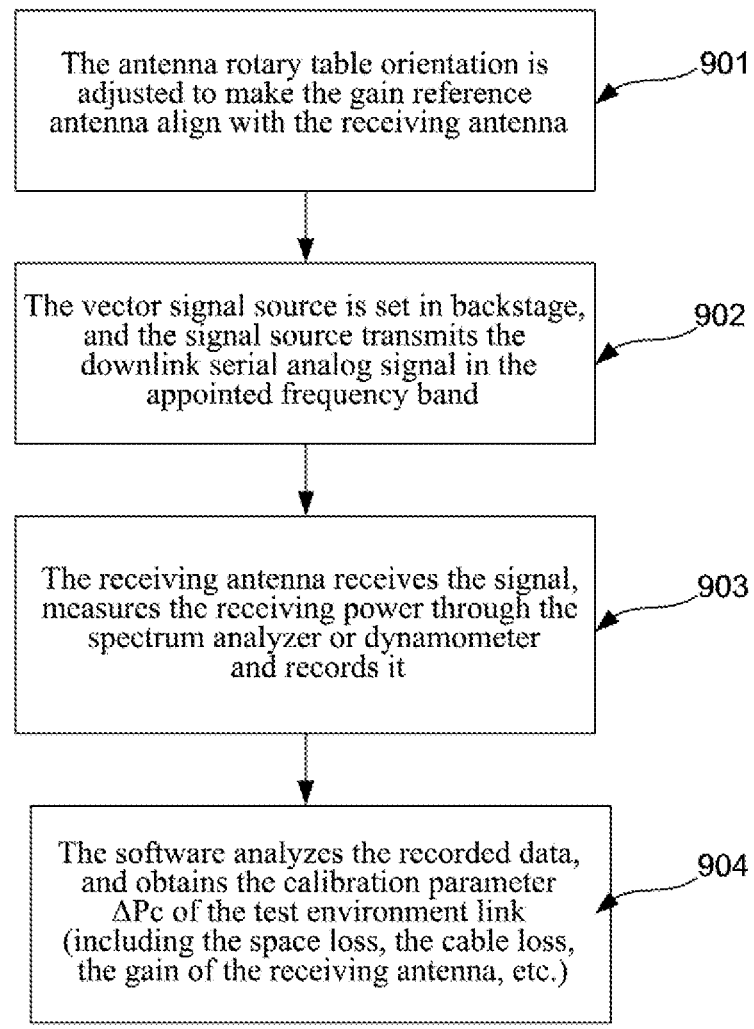
FIG. 9 is a work flow chart of calibration work in an OTA test environment of an embodiment of the present document.

The environment calibration can be performed referring to the steps as shown in FIG. 9, including the following key steps specifically.

In step 901, the antenna rotary table 206 and the antenna bracket 207 are adjusted to make the gain reference antenna 202 align with the receiving antenna 203.

In step 902, the vector signal generator 208 is set to transmit the downlink serial analog signal in the appointed frequency band.

In step 903, the signal is received through the receiving antenna 203, input into the spectrum analyzer or dynamometer 209, to obtain the corresponding received signal power and record the data, and the calculation method is as follows:

$$Py - Px = Lx + (Ly - Gh + Ls) - Gs \quad \text{Formula (1)}$$

Wherein, Py is the power value of the serial analog signal output by the vector signal generator 208.

Px is the power value of the spectrum analyzer or the dynamometer 209.

Gh is the gain of the receiving antenna.

Gs is the gain of the gain reference antenna.

Ly is the loss of the radio frequency cable 204.

Lx is the loss of the radio frequency cable 205.

Ls is the space path loss in the OTA environment.

In formula (1), Py and Gs are already known. Px and Lx can be obtained from the measurement, and the calibration parameter ΔPc of the test environment link (including the space loss, the cable loss, the gain of the receiving antenna, etc.) can be obtained through the formula calculation.

$$\Delta Pc = (Ly - Gh + Ls) = Py - Px - Lx + Gs \quad \text{Formula (2)}$$

The calibration parameter ΔPc is the reference parameter to perform every test of the active antenna system under the test environment.

2), The Downlink Spatial Characteristic Test of the Active Antenna System

Figure 7:
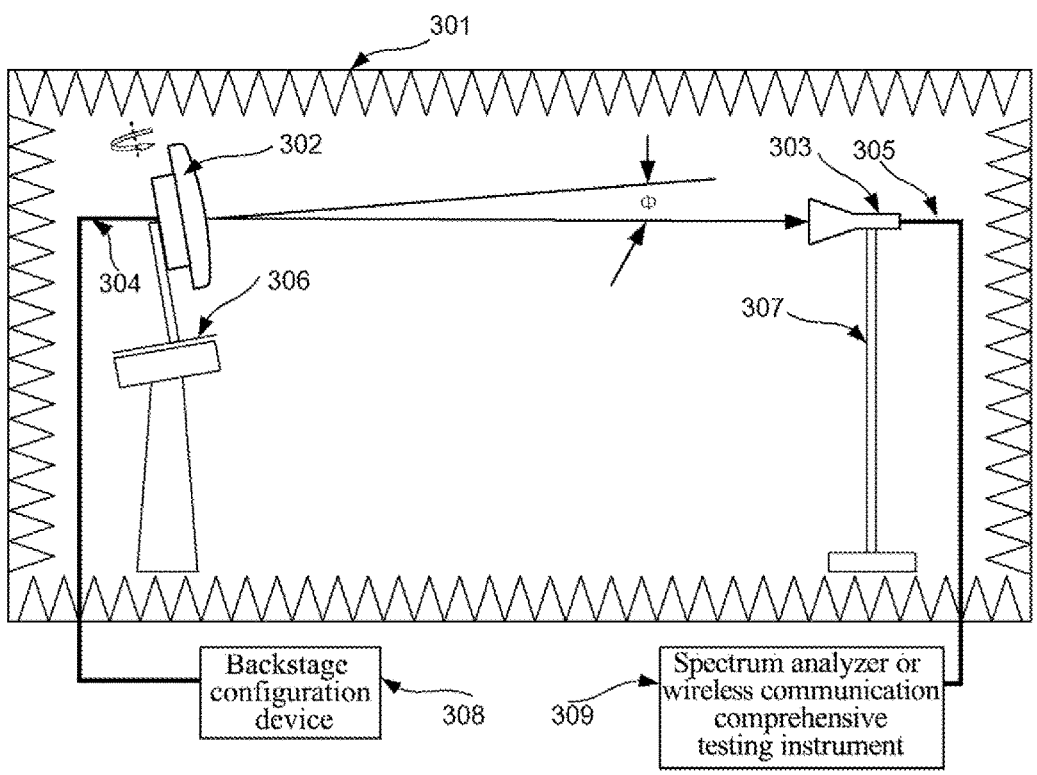
FIG. 7 is a functional block diagram of a downlink spatial characteristic test work of an active antenna system.

Referring to FIG. 7, the test environment is set. Under the environment of the darkroom 301, the active antenna system 302 is installed on the antenna rotary table 306, and connected with the backstage configuration device 308 through the optical fiber 304; at another end, the receiving antenna 303 is installed on the antenna bracket 307, and is connected to the spectrum analyzer or the wireless communication comprehensive testing instrument 309 through the radio frequency cable 305.

Figure 10:
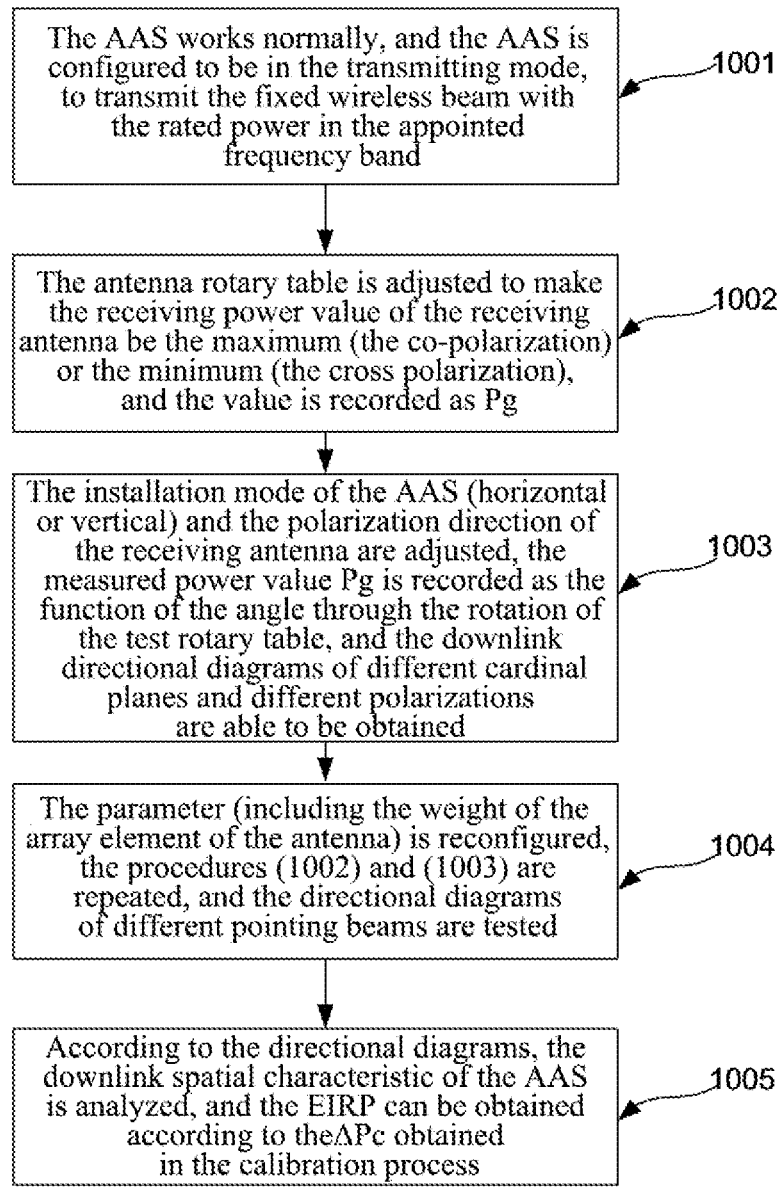
FIG. 10 is a flow chart of a downlink spatial characteristic test work of an active antenna system according to an embodiment of the present document.

It is performed referring to the steps as shown in FIG. 10, including the following key steps specifically.

In step 1001, the active antenna system 302 and the backstage configuration device 308 start and work normally, the active antenna system 302 is made to be in the transmitting mode through configuring the parameter for the backstage, to transmit the fixed wireless beam with the rated power in the appointed frequency band.

In step 1002, the antenna rotary table 306 is adjusted to make the active antenna system 302 and the receiving antenna 303 reach the optimum directing in horizontal and pitching directions, to make the power value (Pg) measured by its spectrum analyzer or the wireless communication comprehensive testing instrument 309 be the maximum (used for the co-polarization test) or the minimum (used for the cross polarization test).

In step 1003, the active antenna system 302 is rotated in orientation on the antenna rotary table 306, and records the power value (Pg) received by the spectrum analyzer as the function of the angle; and adjusts the installation mode of the active antenna system 302 (horizontal or vertical) and the polarization direction of the receiving antenna 303 at the same time, and can obtain the directional diagrams of different cardinal planes (horizontal or vertical) and different polarizations, etc.

In step 1004, the configuration parameter of the active antenna system 302 (including the weight of the array element of the antenna) is adjusted or reconfigured, and the directional diagrams of different pointing beams can be obtained by repeating step 1002 and step 1003.

In step 1005, according to the test data in step 1002~step 1004, the downlink spatial characteristic of the AAS is analyzed, and the EIRP can be obtained according to the ΔPc obtained in the calibration process:

$$EIRP = Pt + Gt = Pg + (Ly - Gh + Ls) = Pg + \Delta Pc \quad \text{Formula (3)}$$

Wherein, Pt is the output rated power of the active antenna system.

Gt is the gain of the array element of the transmitting antenna.

Pg is the power value measured by the spectrum analyzer 309.

ΔPc is the calibration parameter.

3), The Uplink Spatial Characteristic Test of the Active Antenna System

Figure 8:
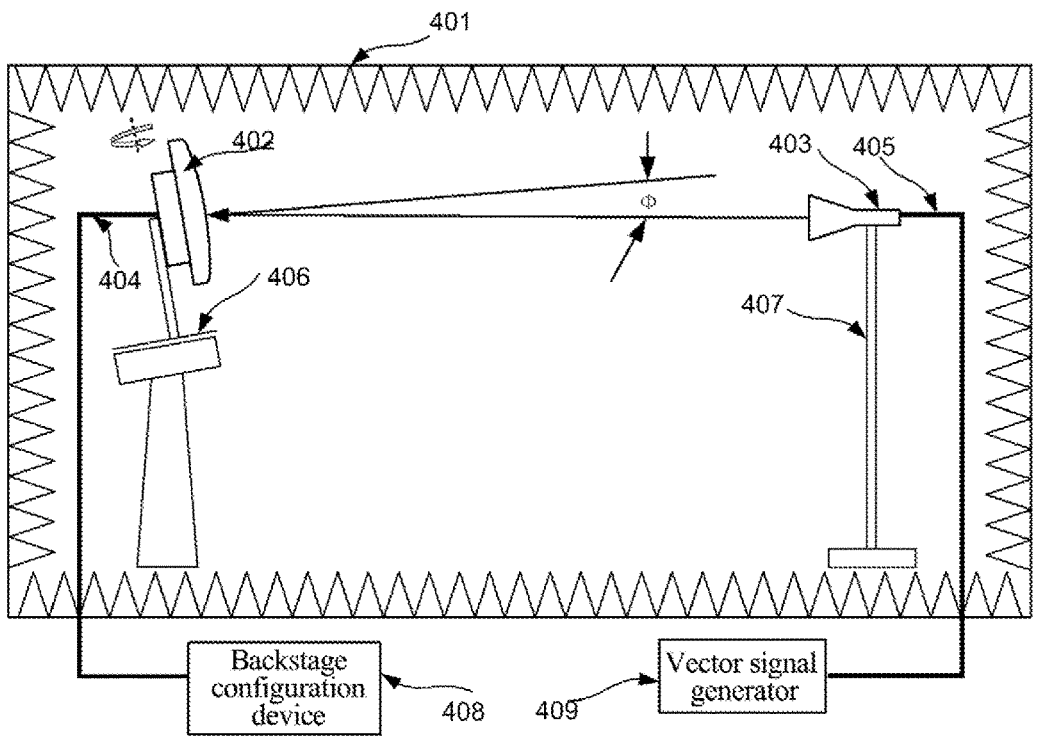
FIG. 8 is a functional block diagram of an uplink spatial characteristic test work of an active antenna system.

Referring to FIG. 8, the test environment is set. Under the environment of the darkroom 401, the active antenna system 402 is installed on the antenna rotary table 406, and connected with the backstage configuration device 408 through the optical fiber 404; at the other end, the transmitting antenna 403 is installed on the antenna bracket 407, and is connected to the vector signaling generator 409 through the radio frequency cable 405.

Figure 11:
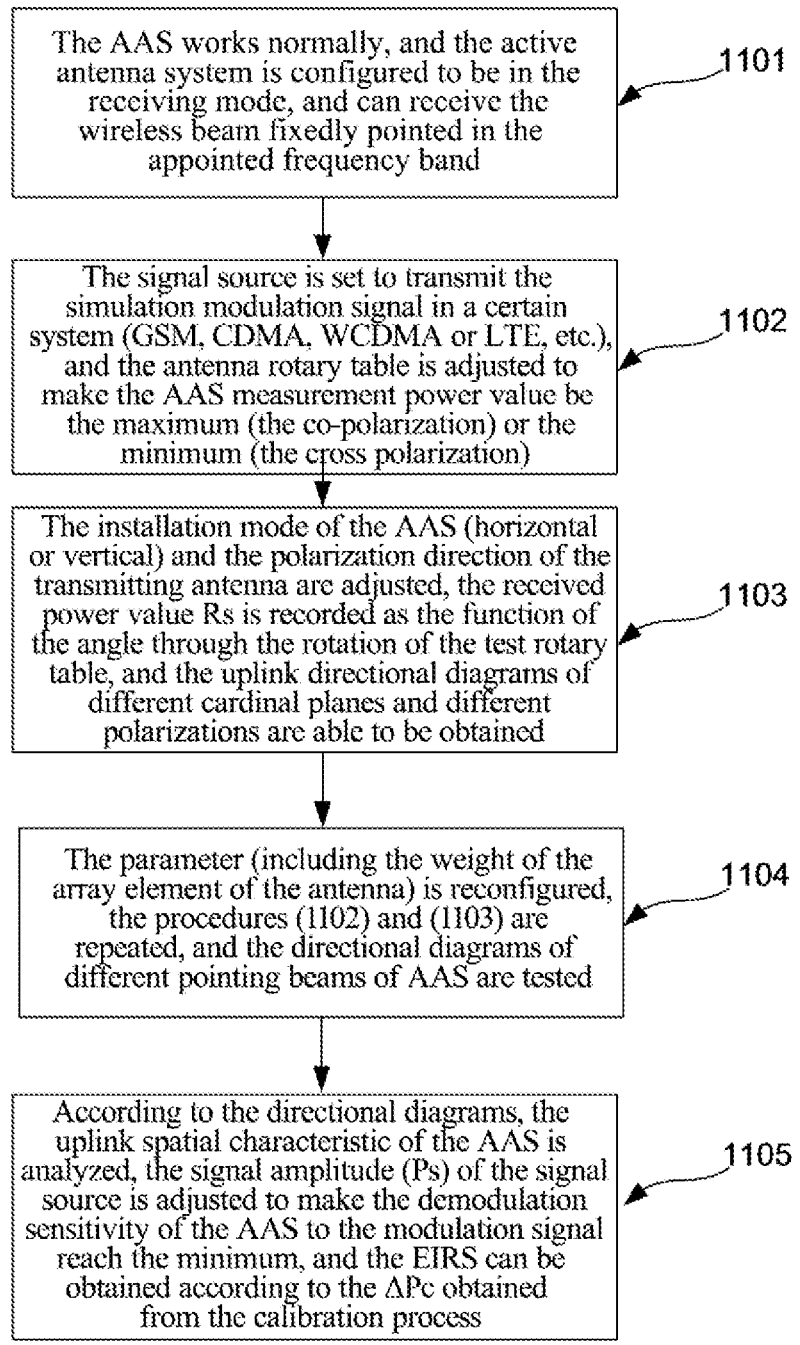
FIG. 11 is a flow chart of an uplink spatial characteristic test work of an active antenna system according to an embodiment of the present document.

It is performed referring to the steps as shown in FIG. 11, including the following key steps specifically.

In step 1101, the active antenna system 402 and the backstage configuration device 408 start and work normally, the active antenna system 402 is made to be in the receiving mode through configuring the parameter for the backstage, and can receive the wireless beam fixedly pointed by the appointed frequency band.

In step 1102, the vector signal generator 409 is set to transmit the simulation modulation signal in a certain system (GSM, CDMA, WCDMA or LTE, etc.) in the appointed frequency band, and the antenna rotary table 406 is adjusted to make the active antenna system 402 and the transmitting antenna 403 reach the optimum directing in horizontal and pitching directions, to make the measured power value of its active antenna system 402 be the maximum (used for the co-polarization test) or the minimum (used for the cross polarization test).

In step 1103, the active antenna system 402 is rotated in orientation on the antenna rotary table 406, and records its received power value (Rs) as the function of the angle; and can adjust the installation mode of the active antenna system 402 (horizontal or vertical) and the polarization direction of the transmitting antenna 403 respectively, and can receive the directional diagrams of different cardinal planes (horizontal or vertical) and different polarizations.

In step 1104, the configuration parameter of the active antenna system 402 (including the weight of the array element of the antenna) is adjusted, and the directional diagrams of different pointing beams can be obtained by repeating step 1102 and step 1103.

In step 1105, according to the test data in step 1101~step 1104, the uplink spatial characteristic of the AAS is analyzed, the signal amplitude (Ps) of the vector signal generator 409 is adjusted to make the demodulation sensitivity of the active antenna system 402 to the modulation signal reach the minimum, and the EIRS can be obtained.

$$EIRS=Rs-Gr=Ps-(Ly-Gh+Ls)=Ps-\Delta Pc \quad \text{Formula (4)}$$

Wherein, Rs is the received power level detected by the active antenna system.

Gr is the gain of the receiving antenna.

Ps is the power value of the modulation signal output by the vector signal generator 409.

ΔPc is the reference parameter.

Because the performance of the antenna array part of the active antenna system is determined by the mechanical performance of the antenna design, which can guarantee that the performance is stable in the large batch production and can meet the retest requirement, the spatial characteristic test of the active antenna system only needs once or several times, and it can obtain the spatial characteristic of the AAS.

In sum, by adopting the method and apparatus described by the embodiment of the present document, it can realize the comprehensive test of the wireless index including the radio frequency index and the space index of the active antenna system. Compared with the related art, it solves the testing efficiency and the testing cost problem brought by the OTA test very well; at the same time, through the mode of probe-type testing and the near field coupling, it solves the problem brought by that there is no external radio frequency port in the active antenna system device, can regard the tested piece as a black box to test, and can well inherit the testing standard, the testing method, the testing tool and the test environment, etc., of the traditional base station, and is a valid practical testing method in the steps, such as, device production and product certification, etc.; in a word, on the premise of guaranteeing the test requirement, it saves the testing cost, improves the testing efficiency, and can be accepted and authorized by the user very easy at the same time.

The above description is only the preferred embodiments of the present document and is not intended to limit the present document. The present document can have a variety of other embodiments. Those skilled in the art can make the corresponding modifications and variations according to the present document without departing from the spirit and essence of the present document. And all of these modifications or the variations should be embodied in the scope of the appending claims of the present document.

Obviously, it can be understood by those skilled in the art that each module or each step above-mentioned in the present document can be implemented by the universal calculating apparatus, and they can be integrated in a single calculating apparatus, or distributed in the network made up by a plurality of calculating apparatus. Alternatively, they can be implemented by the executable program codes of the calculating apparatus. Accordingly, they can be stored in the storage apparatus and implemented by the calculating apparatus, or they are made to each integrated circuit module respectively, or a plurality of modules or steps therein are made into the single integrated circuit module to be implemented. This way, the present document is not limit to any specific form of the combination of the hardware and software.

INDUSTRIAL APPLICABILITY

By adopting the method and apparatus described by the embodiment of the present document, it can realize the comprehensive test of the wireless index including the radio frequency index and the space index of the active antenna system. Compared with the related art, it solves the testing efficiency and the testing cost problem brought by the OTA test very well; at the same time, through the mode of probe-type testing the near field coupling, it solves the problem brought by that there is no external radio frequency port in the active antenna system device, can regard the tested piece as a black box to test, and can well inherit the testing standard, the testing method, the testing tool and the test environment, etc., of the traditional base station, and is a valid practical testing method in the steps, such as, device production and product certification, etc.; in a word, on the premise of guaranteeing the test requirement, it saves the testing cost, improves the testing efficiency, and can be accepted and authorized by the user very easy at the same time. Therefore, the present document has a very strong industrial applicability.

What is claimed is:

1. A method for testing a radio frequency index of an active antenna system, which adopts a testing cover to test the radio frequency index of a tested active antenna system, the method comprising:

a testing cover monomer calibration, performing a cable loss calibration to a radio frequency line of each antenna of the testing cover through a vector network analyzer;

a testing cover environment calibration, putting an antenna part in the testing cover after the monomer calibration, and fixing a spatial relationship between the antenna part and a test probe, and calibrating for a near field coupling environment between each dipole of the antenna part and the testing cover through moving the test probe; wherein, an dipole structure and composition mode of the antenna part are same as an antenna feeder part of the tested active antenna system, and the test probe is a standard antenna dipole; and a radio frequency index test, putting the tested active antenna system into the testing cover after an environment calibration, and fixing a spatial relationship between a dipole corresponding to the tested active antenna system and the test probe, wherein the test environment thereof is the same as a test environment after the testing cover environment calibration, performing radio frequency test on the tested active antenna system through a radio frequency port of the test probe after compensating the test environment according to a calibration result obtained from the calibration, and obtaining the radio frequency index of the radio frequency port of the tested active antenna system.

2. The testing method according to claim 1, wherein, the step of compensating the test environment according to a calibration result obtained from the calibration comprises:

compensating the test environment according to a testing cover monomer calibration table obtained by the testing cover monomer calibration and a test environment calibration table obtained by the testing cover environment calibration.

3. The testing method according to claim 1, further comprising:

testing antenna electrical performance of the tested active antenna system by adopting the antenna part.

4. The testing method according to claim 1, wherein, the step of fixing a spatial relationship between a dipole corresponding to the tested active antenna system and the test probe comprises:

making a polarization direction of the test probe be a same direction as a polarization direction of the dipole corresponding to the tested active antenna system.

5. A method for testing a wireless index of an active antenna system, comprising a radio frequency index test described in claim 1, further comprising:

testing a spatial characteristic index of the tested active antenna system by adopting an over the air (OTA) test.

6. The testing method according to claim 5, wherein, the OTA test is conducted in a darkroom or a simulation freedom space environment, to test a directional diagram of the tested active antenna system.

7. The testing method according to claim 6, further comprising:

calibrating a test environment of the OTA.

8. The testing method according to claim 5, wherein, the OTA test comprises:

a downlink space characteristic test of the tested active antenna system: obtaining an Effective Isotropic Radiated Power (EIRP) through compensating the directional diagram of the tested active antenna system.

9. The testing method according to claim 5, wherein, the OTA test comprises:

an uplink space characteristic test of the tested active antenna system: obtaining an Effective Isotropic Reference Sensitivity (EIRS) through compensating the directional diagram of the tested active antenna system.

10. An apparatus for testing a radio frequency index of an active antenna system, comprising a shielding box, a positioning bracket, an antenna part, an antenna radio frequency line, a test probe, a probe location adjustment unit and a retractable absorbing plate, wherein:

the antenna part has a dipole structure and composition mode same as an antenna feeder part of the tested active antenna system, configured to be used for calibration of the testing apparatus and an antenna array test of the tested active antenna system; a monomer calibration as a cable loss calibration for the antenna radio frequency line of each antenna of the testing apparatus is performed through a vector network analyzer;

a testing environment calibration is performed by putting the antenna part in the testing apparatus after the monomer calibration, and fixing a spatial relationship between the antenna part and a test probe, and calibrating for a near field coupling environment between each dipole of the antenna part and the testing apparatus through moving the test probe; wherein, an dipole structure and composition mode of the antenna part are same as an antenna feeder part of the tested active antenna system, and the test probe is a standard antenna dipole;

the test probe is a standard antenna dipole;

the shielding box is configured to: form a space electromagnetic environment between the testing apparatus and the tested active antenna system;

the absorbing plate is located between the positioning bracket and the test probe; and the positioning bracket is configured to: fix the antenna part or the tested active antenna system, and adjust orientation of the antenna part or the tested active antenna system.

11. The testing apparatus according to claim 10, further comprising a probe location adjustment unit, wherein:

the probe location adjustment unit is configured to: fix and adjust the orientation of the test probe.

12. The testing apparatus according to claim 11, wherein, the probe location adjustment unit comprises a slide guide rail set on a body of the shielding box.

13. The testing apparatus according to claim 10, wherein, when testing a branch of the tested active antenna, the absorbing plate between the test probe and the dipole corresponding to the branch is unfolded, and the microwave plates at other locations are folded.

14. The testing method according to claim 6, wherein, the OTA test comprises:

a downlink space characteristic test of the tested active antenna system: obtaining an Effective Isotropic Radiated Power (EIRP) through compensating the directional diagram of the tested active antenna system.

15. The testing method according to claim 7, wherein, the OTA test comprises:

a downlink space characteristic test of the tested active antenna system: obtaining an Effective Isotropic Radiated Power (EIRP) through compensating the directional diagram of the tested active antenna system.

16. The testing method according to claim 6, wherein, the OTA test comprises:
an uplink space characteristic test of the tested active antenna system: obtaining an Effective Isotropic Reference Sensitivity (EIRS) through compensating the directional diagram of the tested active antenna system.

17. The testing method according to claim 7, wherein, the OTA test comprises:
an uplink space characteristic test of the tested active antenna system: obtaining an Effective Isotropic Reference Sensitivity (EIRS) through compensating the directional diagram of the tested active antenna system.

18. The testing apparatus according to claim 11, wherein, when testing a branch of the tested active antenna, the absorbing plate between the test probe and the dipole corresponding to the branch is unfolded, and the microwave plates at other locations are folded.

19. The testing apparatus according to claim 12, wherein, when testing a branch of the tested active antenna, the absorbing plate between the test probe and the dipole corresponding to the branch is unfolded, and the microwave plates at other locations are folded.

* * * * *